US006949473B2

(12) United States Patent
Biard et al.

(10) Patent No.: US 6,949,473 B2
(45) Date of Patent: Sep. 27, 2005

(54) METHODS FOR IDENTIFYING AND REMOVING AN OXIDE-INDUCED DEAD ZONE IN A SEMICONDUCTOR DEVICE STRUCTURE

(75) Inventors: James R. Biard, Richardson, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 342 days.

(21) Appl. No.: 10/156,324

(22) Filed: May 24, 2002

(65) Prior Publication Data

US 2003/0219921 A1 Nov. 27, 2003

(51) Int. Cl.[7] ................................................ H01L 21/31

(52) U.S. Cl. ....................................... 438/759; 438/781

(58) Field of Search ................................ 438/759, 781, 438/423, 473, 663, 773, 45; 372/43–46

(56) References Cited

U.S. PATENT DOCUMENTS

| | | | | | |
|---|---|---|---|---|---|
| 5,262,360 | A | | 11/1993 | Holonyak, Jr. et al. | |
| 5,373,522 | A | | 12/1994 | Holonyak, Jr. et al. | |
| 5,493,577 | A | | 2/1996 | Choquette et al. | |
| 5,567,980 | A | | 10/1996 | Holonyak, Jr. et al. | |
| 5,581,571 | A | | 12/1996 | Holonyak, Jr. et al. | |
| 5,696,023 | A | | 12/1997 | Holonyak, Jr. et al. | |
| 5,896,408 | A | | 4/1999 | Corzine et al. | |
| 5,897,329 | A | * | 4/1999 | Jewell | 438/38 |
| 5,903,588 | A | | 5/1999 | Guenter et al. | |
| 5,903,589 | A | | 5/1999 | Jewell | |
| 5,978,408 | A | | 11/1999 | Thornton | |
| 6,014,395 | A | | 1/2000 | Jewell | |
| 6,208,681 | B1 | | 3/2001 | Thornton | |
| 6,269,109 | B1 | | 7/2001 | Jewell | |
| 6,297,068 | B1 | | 10/2001 | Thornton | |
| 6,372,533 | B2 | | 4/2002 | Jayaraman et al. | |
| 6,714,572 | B2 | * | 3/2004 | Coldren et al. | 372/46 |
| 6,743,495 | B2 | * | 6/2004 | Vasat et al. | 428/64.1 |
| 6,816,526 | B2 | * | 11/2004 | Biard et al. | 372/46 |

OTHER PUBLICATIONS

Ramaswamy et al. "Electrical Characteristics of Proton–Implanted Vertical Cavity Surface Emitting Lasers", Nov. 1998, IEEE Journal of Quantom Electronics, vol. 34, No. 11, pp. 2233–2240.*

Bowers, J., et al., "Fused vertical cavity lasers with oxide aperture", final report 1996–97 for MICRO project 96–042.

Choe, J.S., et al., "Lateral oxidation of AlAs layers at elevated water vapour pressure using a closed–chamber system", letter to the editor, Semicond. Sci. Technol., 15 (2000), pp. L35–L38.

Chua, C.L., et al., "Low–threshold 1.57–μm VC–SEL's using strain–compensated quantum wells and oxide/metal backmirror", article, IEEE Photonics Technology Letters, vol. 7, No. 5, pp. 444–446, May 1995.

(Continued)

*Primary Examiner*—Alonzo Chambliss
(74) *Attorney, Agent, or Firm*—Workman Nydegger

(57) ABSTRACT

A method and system for identifying and/or removing an oxide-induced dead zone in a VCSEL structure is disclosed herein. In general, a VCSEL structure can be formed having at least one oxide layer and an oxide-induced dead zone thereof. A thermal annealing operation can then be performed upon the VCSEL structure to remove the oxide-induced dead zone, thereby permitting oxide VCSEL structures thereof to be reliably and consistently fabricated. An oxidation operation may initially be performed upon the VCSEL structure to form the oxide layer and the associated oxide-induced dead zone. The thermal annealing operation is preferably performed upon the VCSEL after performing a wet oxidation operation upon the VCSEL structure.

12 Claims, 4 Drawing Sheets

OTHER PUBLICATIONS

Chua, C.L., et al., "Planar laterally oxidized vertical–cavity lasers for low–threshold high–density top–surface emitting arrays", article, IEEE Photonics Technology Letters, vol. 9, No. 8, pp. 1060–1062, Aug. 1997.

Farrier, R.C. "Parametric control for wafer fabrication: new CIM techniques for data analysis," Solid State Technology, Sep. 1997.

Fushimi, H., and Wada, K, "Degradation Mechanism in Carbon–doped GaAs Minority–carrier Injection Devices," 1996 IEEE International Reliability Physics Proceedings; (1996), pp. 214–220.

Greib, K.M., et al., "Comparison of fabrication approaches for selectively oxidized VCSEL arrays", article, Vertical–Cavity Surface–Emitting Lasers IV, Proceedings of SPIE, vol. 3946, pp. 36–40, 2000.

Guenter, J., et al., "Commercialization of Honeywell's VCSEL Technology: Further Developments," in Vertical–Cavity Surface–Emitting Lasers V, Choquette, K.D. and Lei, C., editors, Proceedings of the SPIE vol. 4286, (2001), pp. 1–14.

Guenter, J., et al., "Reliability of proton–implanted VCSELs for data communications," in Fabrication, Testing, and Reliability of Semiconductor Lasers, Fallahi, M. and Wang, S. editors, Proceedings of the SPIE, vol. 2683, (1996), pp. 102–113.

Hawthorne, R.A, et al., "Reliability Study of 850 nm VCSELs for Data Communications," 1996 IEEE International Reliability Physics Proceedings, 34, (1996), pp. 203–210.

Herrick, R.W., et al., "Highly reliable oxide VCSELs manufactured at HP/Agilent Technologies," in Vertical–Cavity Surface–Emitting Lasers IV, Choquette, K.D. and Lei, C., editors, Proceedings of the SPIE vol. 3946, (2000), pp. 14–19.

Kash, J.A., et al., "Recombination in GaAs at the AlAs oxide–GaAs interface," Appl. Phys. Lett. 67 (14), Oct. 2, 1995; pp 2022–2024.

Koley, B., et al., "Dependence of lateral oxidation rate on thickness of AlAs layer of interest as a current aperture in vertical–cavity surface–emitting laser structures", article, Journal of Applied Physics, vol. 84, No. 1, pp. 600–605, Jul. 1, 1998.

Maeda, K., and Takeuchi, S., "Enhanced Glide of Dislocations in GaAs Single Crystals by Electron Beam Irradiation," Japanese Journal of Applied Physics, vol. 20, No. 3 (1981), pp. L165–L168.

Osinki, M., et al., "Temperature and thickness dependence of steam oxidation of AlAs in cylindrical mesa structures", article, IEEE Photonics Technology Letters, vol. 13, No. 7, pp. 687–689, Jul. 2001.

Peck, D. Stewart, "Comprehensive Model for Humidity Testing Correlation," 1986 IEEE International Reliability Physics Proceedings; (1986), pp. 44–50.

Ries, M.J., et al., "Visible–Spectrum (λ=650 nm) photo-pumped (pulsed, 300 K) laser operation of a vertical–cavity AlAs–AlGaAs/InAlP–InGaP quantum well heterostructure utilizing native oxide mirrors", article, Appl. Phys. Lett. 67, pp. 1107–1109, Aug. 1995.

Sah, C–T, et al., "Carrier Generation and Recombination in P–N Junctions and P–N Junction Characteristics," Proceedings of the IRE, Sep. 1957, pp 1228–1243.

Shi, S., et al., "Photoluminescence study of hydrogenated aluminum oxide–semiconductor interface," Appl. Phys. Lett. '70 (10), Mar. 10, 1997; pp 1293–1295.

Spicer, W.E., et al., "The Unified Model For Schottky Barrier Formation and MOS Interface States in 3–5 Compounds," Applications of Surface Science, 9 (1981); pp 83–91.

Tao, A., "Wet–oxidation of digitally alloyed AlGaAs", article, National Nanofabrication Users Network, pp. 74–75.

Tatum, J.A., et al., "Commercialization of Honeywell's VCSEL Technology," in Vertical–Cavity Surface–Emitting Lasers IV, Choquette, K.D. and Lei, C., editors, Proceedings of the SPIE vol. 3946, (2000), pp. 2–13.

Wieder, H.H., "Fermi level and surface barrier of GaxIn1–xAs alloys," Appl. Phys. Lett. 38 (3), Feb. 1, 1981; pp 170–171.

Wipiejewski, T., et al., "VCSELs for datacom applications, ", in Vertical–Cavity Surface–Emitting Lasers III, Choquette, K.D. and Lei, C., editors, Proceedings of the SPIE vol. 3627, (1999), pp. 14–22.

Hawkins, B., et al. "Reliability of various size oxide aperture VCSELs", article, 2002 Electronic Components and Technology Conference, May 30, 2002, ISBN 0–7803–7430–4, pp. 540–550.

Floyd P D et al. "Low–Threshold Laterally Oxidized GainP–AlgainP Quantum–Well Laser Diodes" IEEE Photonics Technology Letters, IEEE Inc. New York, US, vol. 10, No. 1, 1998, pp. 45–47.

Fushimi H et al. "Degradation mechanism in carbon–doped GaAs minority–carrier injection devices", Reliability Physics Symposium, 1996, 34th Annual Proceedings., IEEE International Dallas, TX, US, Apr. 30–May 2, 1996.

Ko J et al., "Low–Threshold 840–nm Laterally Oxidized Vertical–Cavity Lasers Using Alingaas–Algaas strained active layers", IEEE Photinics Technology Letters, IEEE Inc. New York, US, vol. 9, No. 7, Jul. 1, 1997.

International Search Report, dated Nov. 7, 2003, relative to PCT application No. PCT/US 03/16555, the foreign equivalent to the instant U.S. Appl. No. 10/156,324.

* cited by examiner

METHODS FOR IDENTIFYING AND REMOVING AN OXIDE-INDUCED DEAD ZONE IN A SEMICONDUCTOR DEVICE STRUCTURE

TECHNICAL FIELD

The present invention generally relates to vertical cavity surface emitting lasers (VCSELs). The present invention also relates to methods and systems for evaluating VCSEL devices for performance optimization thereof. The present invention also relates to oxide VCSEL devices.

BACKGROUND OF THE INVENTION

Solid-state semiconductor lasers are important devices in applications such as high-speed printing systems and opto-electronic communication systems. Semiconductor lasers have become increasingly important in recent years. One of the most important applications of semiconductor lasers is in communication systems where fiber optic communication media are employed. With growth in electronic communication, communication speed has become more important in order to increase data bandwidth in electronic communication systems. Improved semiconductor lasers can play a vital roll in increasing data bandwidth in communication systems using fiber optic communication media such as local area networks (LANs), metropolitan area networks (MANs) and wide area networks (WANs). A preferred component for optical interconnection of electronic components and systems via optical fibers is, thus, a semiconductor laser.

One type of well-known semiconductor laser is a vertical cavity surface emitting laser (VCSEL). The current state of design and operation of VCSELs is well known. Recently, there has been an increased interest in VCSELs, although edge-emitting lasers are still currently used in some applications. A VCSEL is thus a light-emitting device well known in the art. A reason for the interest in VCSELs is that edge-emitting lasers can produce a beam with a large angular divergence, thereby making the efficient collection of the emitted beam more difficult. Furthermore, edge-emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSELs incorporate the mirrors monolithically in their design, they allow for on-wafer testing and the fabrication of one-dimensional or two-dimensional laser arrays.

In any semiconductor device, there is a complex interplay of performance requirements, layout and technology options, and fundamental physics that constrains the final design. This is definitely the case for VCSELs. A typical VCSEL configuration includes an active region between two mirrors, disposed one after another on the surface of the substrate wafer. An insulating region forces the current to flow through a small aperture, and the device lases perpendicular to the wafer surface (i.e., the "vertical" part of VCSEL). One type of VCSEL in particular, the proton VCSEL, wherein the insulating region is formed by a proton implantation, dominated the early commercial history of VCSELs. More recently, the oxide-guided VCSEL has become available. In this device, the insulating region is formed by partial oxidation of a thin, high aluminum-content layer within the structure of the mirror. This same oxidation process can be applied to other semiconductor structures, to produce both optoelectronic and purely electronic devices. Both proton and oxide VCSELs can be isolated in the wafer by proton bombardment.

There are a number of obvious design possibilities, such as the oxide thickness, vertical placement, and aperture diameter, as well as many others dealing with design of mirrors, active regions, and doping, all of which can affect the final performance. It is possible to establish a basic design and to produce a wide range of behaviors simply by adjusting the aperture diameters. In particular, decreasing the oxide aperture diameter generally decreases the threshold current, but this inevitably increases the device electrical resistance and thermal impedance, because the current must pass through a smaller constriction. As a result, there are inevitable size-related tradeoffs between performance and reliability. Similar decisions must be made about differential efficiency (primarily controlled by top and bottom mirror reflectivity), temperature performance (primarily controlled by alignment of Fabry-Perot cavity wavelength and gain peak wavelength), and speed (controlled by many factors). Invariably, however, the oxidation process induces a region surrounding the oxide, but not itself oxidized, to have a high resistance, due to the presence of defects originating during the oxidation.

One of the primary reasons proton-implanted VCSELs have been commercially successful is their outstanding reliability performance over the competing edge-emitting lasers. Because reliability is so critical for VCSEL users, there has been understandable concern about the reliability performance of the newer oxide VCSELs. As with many issues, this one does not have a simple answer. Oxide VCSEL manufacturers employ designs with significant differences in the epitaxial structure as well as thickness, sizing, and placement of the oxide aperture layer. Honeywell reliability testing, both on a variety of internal designs and on competitive products, has demonstrated a wide range of reliability results for different oxide VCSEL designs. These differences can affect reliability either by changing the magnitude of the effect of failure modes or by introducing new ones, such as mechanical stress due to differential thermal expansion of the oxide relative to the semiconductor material. Failure modes such as these can be insidious, as they may not be seen in high-temperature life tests. For these reasons, oxide VCSEL reliability must be assessed for each particular oxide design, and the reliability effects of design choices must be understood through extensive reliability testing.

Reliability performance for oxide VCSEL products is an important design and fabrication issue. By systematically testing numerous design options through statistical experimentation techniques, the reliability impact of such choices can be understood. Beyond life tests of the type described herein it is important to incorporate reliability process monitoring protocols into any VCSEL design and fabrication system. Such protocols can include, for example, qualifying each wafer for production use by assessing its parametric stability and long-term reliability through sample life testing, as well as quarterly long-term life testing of a sample from production stock.

Reliability results can affect one of the possible design decisions: aperture diameter. As mentioned earlier, each choice may be suitable for a particular application, so there is not necessarily one "best" option. Note that as utilized herein, the term "reliability" generally relates to the tendency of a device to wear out, or to the lifetime of the device itself. Short-term reliability effects are dominated by changes (i.e., an increase or decrease) in device characteristics and, thus, the need for device stabilization.

Life-testing methodologies have been described many times before. For example, Hawthorne, et al., "Reliability Study of 850 nm VCSELs for Data Communications," 1996 IEEE International Reliability Physics Proceedings, 34, (1996), pp. 203–210, describes such a study and is incorporated herein by reference. In such a study, multiple wafers representing several epitaxial growth and chip fabrication lots can be employed—at least 3 lots for each chip type. Chips can be packaged in TO-style devices, subjected to standard production burn-in, and then placed on long-term life testing. Some of the groups may be subjected to air-to-air thermal shocks before starting life testing (this did not impact the results). The burn-in can be performed in dark, forced-air ovens at approximately ten different combinations of constant temperature and DC current. Periodically the parts can be removed from the oven and DC tested at room temperature. Failure can be defined as a 2 dB reduction in output power at a fixed current. While the VCSELs may degrade in a fairly graceful way during life testing (as opposed to sudden, catastrophic degradation), it is not necessary to attempt to estimate extrapolated failure times. Reported failure times are always reported for actual failures.

The primary failure mechanism in all cases (both for the oxide and the proton VCSEL) is most likely related to the presence or generation of dislocations. Edge dislocations that traverse the P-N junction move only as continuous loops by glide or climb along fixed crystallographic directions and form dark line defects (DLDs) by generating a high density of deep point defect traps along their path of motion. DLDs are dark because of the compensating and lifetime killing properties of the deep traps.

The laminar structure of a VCSEL can confine propagating dislocations entirely to the plane of the active region (quantum wells and barriers). As a result, the only orientation in which they would appear linear is parallel to the active plane, in which orientation there would be no illuminated region to contrast with the DLD. From the top, the only direction in which the degradation can practicably be observed, the VCSEL emission appears either to dim gradually, progressing inward from an edge, or to dim nearly uniformly over the entire area. Neither of these conditions is clearly evident at the 2-dB degradation utilized as an end-of-life definition, probably because only a tiny fraction of the outer edge of the active area is involved at that point. The DLDs typically become visible only at 90% or greater degradation.

Two items are required for the propagation of a DLD: a dislocation (or surface) traversing the junction and mechanical stress. As a practical matter, minority carriers would need to be present. Without minority carriers, the activation energy for DLD motion may be enormously increased. For example, this phenomena is indicated in Maeda, et al., "Enhanced Glide of Dislocations in GaAs Single Crystals by Electron Beam Irradiation," Japanese Journal of Applied Physics, Vol. 20, No. 3 (1981), pp. L165–L168, which is incorporated herein by reference. If any one of these three items is missing there will not be DLD degradation. Some mechanical stress is inevitable in the VCSEL; even if not present as a residue of processing, stress will arise from thermal gradients induced by operation. Minority carriers are also inescapable consequences of operation.

Dislocations can come from a variety of sources. VCSEL material growth by MOCVD employs low dislocation density substrates, but the dislocation density is not zero and a small but finite possibility always exists that a substrate dislocation will traverse the P-N junction inside the diameter of the isolation implant. The central portion of the cavity is the most vulnerable. Substrate dislocations in the region under the oxide or gain guide implant will have a reduced effect due to the lateral debiasing. Even if a pre-existing dislocation or surface is not accessible in the region of flowing current, they can be generated in situ. Point defects can be generated near the oxidation layer, and the isolation proton implant produces a high density of point defects that define the perimeter of the P-N junction. Under forward bias, minority carriers that recombine non-radiatively on these point defects impart energy to the defects that allow them to move so as to lower the free energy in the crystal. Aggregation of point defects into a dislocation loop produces a nucleus for DLD propagation and subsequent degradation.

Degradation resulting from grown-in dislocations is generally fairly rapid. In the rare instances where it occurs, it can typically be detected and removed by a short operating burn-in. Generation of dislocations through aggregation of point defects is much slower. It is this mechanism that likely controls the wear-out life of VCSELs. While details of VCSEL degradation remain open issues, it involves a combination of the mechanisms above (and perhaps others) and appears to be fundamentally similar for proton and oxide VCSELs of all sizes.

Thus, defects may be generated in VCSEL devices which can diffuse and drift within a VCSEL structure over the operating life of the VCSEL, thereby resulting in unstable and poorly operating VCSEL devices, particularly in oxide VCSELs. In addition, the presence and amount of these defects, even if in a stable configuration, are difficult to control. Thus, the performance characteristics, which may depend on their presence and amount, will be more variable for devices containing them than for devices from which they have been removed. This removal may also afford different, otherwise unavailable, design opportunities; for example, the removal of the non-conducting zone from beneath an oxide layer may allow it to be placed closer to electrically sensitive regions of the VCSEL. It is this phenomenon that has prompted the present inventors to conclude that a need exists for a method and system for identifying and removing such defects. Removing such defects during the fabrication process makes it possible to optimize the VCSEL and/or other semiconductor devices in a stable and reproducible manner. The present inventors believe that the present invention disclosed herein solves this important need.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present to provide an improved semiconductor device structure.

It is another aspect of the present invention to provide an improved vertical cavity surface-emitting laser (VCSEL).

It is also another aspect of the present invention to provide an improved oxide VCSEL.

It is yet another aspect of the present invention to provide a method and system for evaluating VCSEL devices for performance optimization thereof.

It is still another aspect of the present invention to provide a VCSEL structure having an oxide-induced dead zone.

It is also an aspect of the present invention to provide a thermal annealing process to remove an oxide-induced dead zone of a VCSEL structure and thereby provide consistent fabrication, testing and reliability of oxide VCSEL devices.

The above and other aspects can be achieved as is now described. A method for removing an oxide-induced dead zone in a semiconductor device structure is disclosed herein. In general, a semiconductor device structure can be formed having at least one oxide layer and an oxide-induced dead zone thereof. A thermal annealing operation can then be performed upon the semiconductor device structure to remove the oxide-induced dead zone, thereby permitting oxide semiconductor device structures thereof to be reliably and consistently fabricated. An oxidation operation may initially be performed upon the semiconductor device structure to form the oxide layer and the associated oxide-induced dead zone. The thermal annealing operation is preferably performed upon the semiconductor device after performing a wet oxidation operation or similar operation upon the semiconductor device structure.

In general, at least one defect associated with the oxide layer may be generated as a result of performing the wet oxidation operation upon the semiconductor device structure. Detecting interstitial hydrogen released as a result of the wet oxidation operation performed upon the semiconductor device structure may identify a defect center associated therewith, though other defects as a result of oxidation are also possible. Additionally, a semiconductor material is generally located below the oxide layer, wherein the semiconductor material possesses a sheet resistance thereof. The sheet resistance of the semiconductor material located under the oxide layer is thus an important parameter in determining the performance of an oxide semiconductor device formed thereof. The interstitial hydrogen (or other oxide-induced defect) can be removed via the thermal annealing operation performed upon the semiconductor device structure. The semiconductor device structure can comprise a laser such as a VCSEL. The oxide layer itself can be configured as an insulating oxide layer. The present invention described herein can thus be utilized in association with VCSEL devices and/or other semiconductor device structures to improve control and stability thereof. The present invention thus applies to any semiconductor device relying on the oxidation of, for example, aluminum containing III-V semiconductors.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate an embodiment of the present invention and are not intended to limit the scope of the invention.

Figure 1:
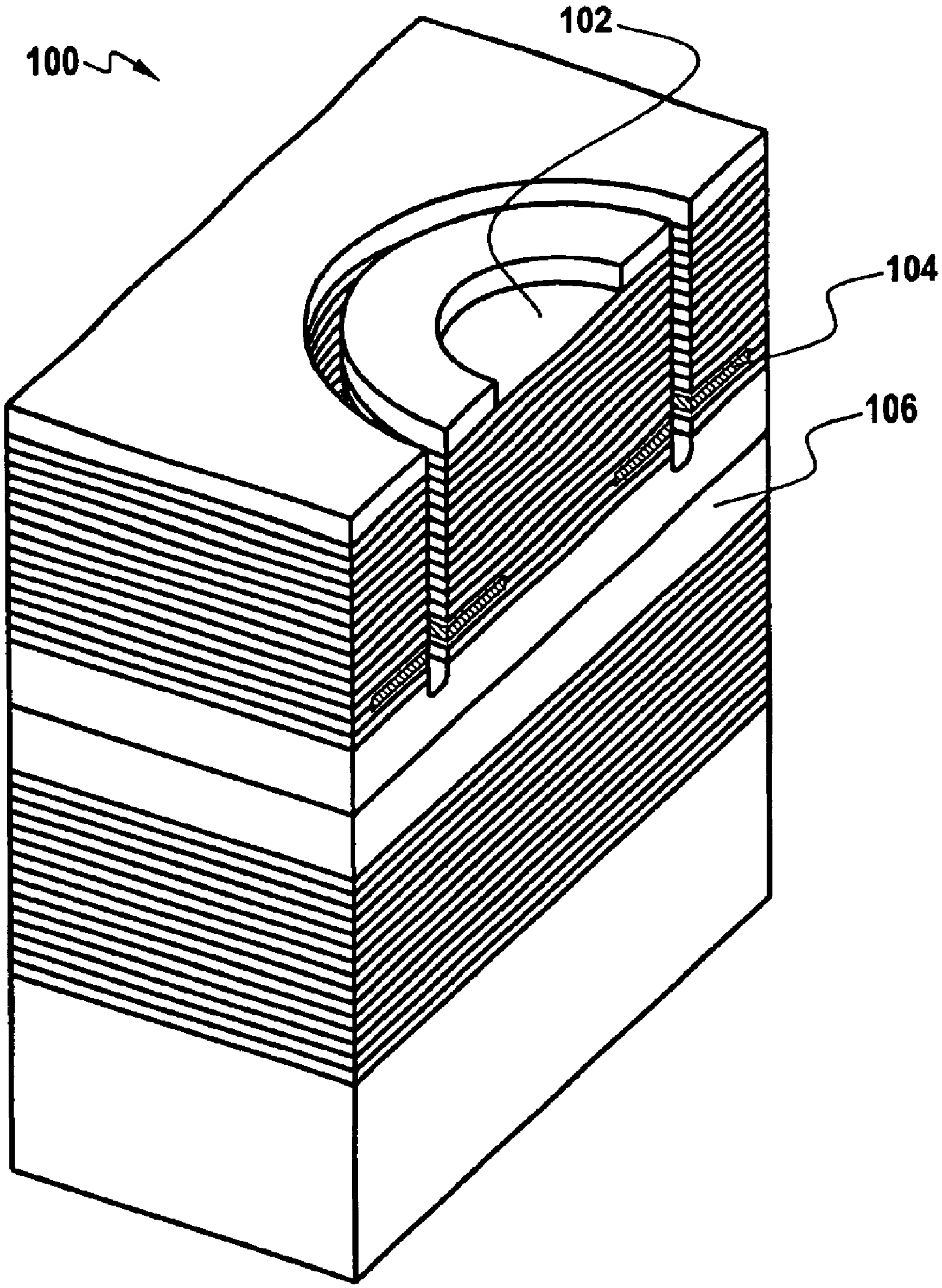
FIG. 1 illustrates a perspective view of an oxide VCSEL device which includes an insulating region that may be formed by partial oxidation of a thin, high aluminum-content layer within the structure of an associated VCSEL mirror, in accordance with a preferred embodiment of the present invention.

FIG. 1 illustrates a perspective view of a VCSEL 100, which includes an insulating region that can be formed by partial oxidation of a thin, high aluminum-content layer within the structure of an associated VCSEL mirror. FIG. 1 represents a schematic cross-sectional view of an oxide-isolated VCSEL 100. As indicated in FIG. 1, VCSEL 100 generally includes an emission aperture 102, an oxide aperture 104 and an active region 106. The diameters of apertures 102 and 104 can range from, for example, about 5 $\mu$m to about 20 $\mu$m. Larger apertures generally exhibit greater reliability.

Figure 2:
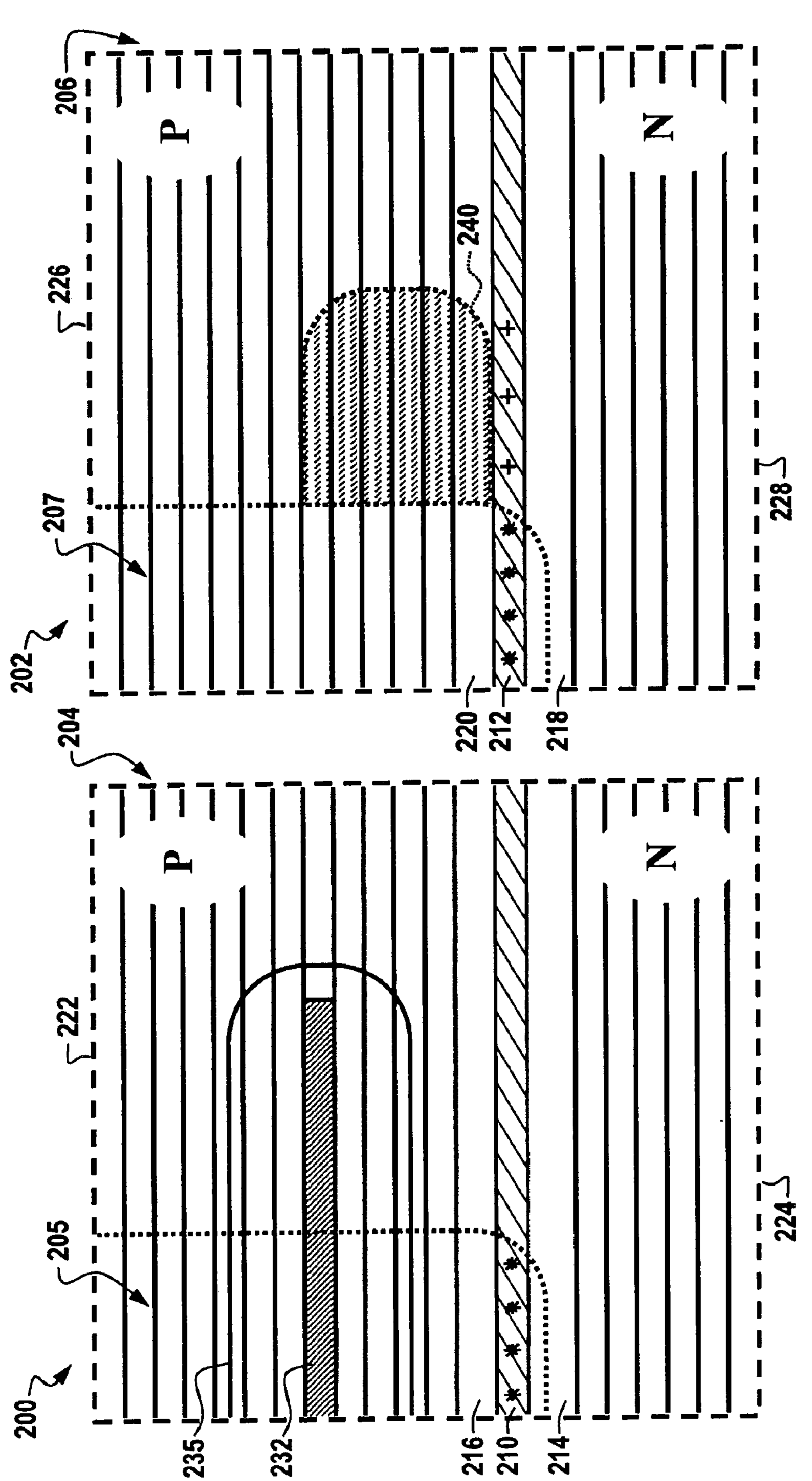
FIG. 2 depicts a detailed view of VCSEL current confinement structures, in accordance with a preferred embodiment of the present invention.

FIG. 2 depicts details of VCSEL current confinement structures 200 and 202. FIG. 2 generally illustrates an enlarged portion of FIG. 1, which schematically illustrates the location of an oxide layer in structure 200 and proton implants in structure 202. Structures 200 and 202 represent typical VCSEL confinement structures. Structure 200 generally comprises an oxide VCSEL, while structure 202 generally represents a proton VCSEL. The right hand edges 204 and 206 of structures 200 and 202 respectively represent the centerline of a VCSEL optical cavity. Note that such a VCSEL cavity generally possesses a radial symmetry. The areas 205 and 207 of structures 200 and 202 respectively represent a multi-energy isolation implant, which can convert the material to a semi-insulating material from the top surface of the VCSEL to a depth below the quantum wells.

The quantum well regions 210 and 212 contain a P-N junction. Quantum well region 210 is located between bands 216 and 214 of VCSEL 200, which respectively represent p-type and n-type spacer layers that set the cavity length of the VCSEL. Similarly, quantum well region 212 is located between bands 220 and 218 of VCSEL 202, which respectively represent p-type and n-type spacer layers that set the cavity length of the VCSEL. A portion of the p-type Bragg mirror can be located on the respective tops 222 and 226 of each figure and a portion of the n-type Bragg mirror can also be located at the bottoms 224 and 228 of each of VCSEL 200 and 202. The area 240 of structure 202 represents the depth and range of the gain-guide implant in proton VCSELs. The high lateral sheet resistance below the gain guide gives excellent debiasing of the P—N junction at the isolation implant perimeter.

In proton VCSELs a significant concentration of point defects is present in the annular region of the junction under the gain guide implant. The location of these point defects is represented by the symbol "+" in the quantum well region under the gain guide implant in structure 202. Neither of these effects is seen in the central region of the cavity inside the gain guide implant aperture.

In oxide VCSEL structures, the wet thermal oxidation process forms an annular ring of aluminum oxide represented by the layer 232 in structure 200. The oxidation process also removes acceptor concentration from the surrounding layers. Analysis of process monitor tests has revealed an important aspect of the oxidation process, which is indicated by line 235 in structure 200. Note that in FIG. 2 line 235 generally surrounds layer 232. A defect is generated in the oxidation and diffusing into the surrounding p-type mirror layers for an effective distance of approximately 400 nm. This defect compensates the acceptors. The acceptor compensation can be removed with a high-temperature annealing immediately following the oxidation. For the wet thermal oxidation process, hydrogen is a good candidate for this defect.

VCSEL-based devices typically incorporate considerable hydrogen. It can originate in epitaxy, in proton implantation, or in oxidation. As an interstitial donor, hydrogen is a highly mobile species that tends to compensate the shallow acceptors in the p-type mirror layers. Hydrogen can be partially removed by high-temperature annealing before wafer processing. Many hydrogen impurities are introduced into the device structure late in the process; however, when significant thermal annealing is not possible because of deleterious effects on intentional structures.

The presence of this hydrogen and other mobile point defects (all of which are generally referred to for convenience only as hydrogen below) has made it necessary to perform a burn-in on both oxide and proton VCSELs to stabilize their characteristics. The stabilization burn-in is performed at elevated temperature and high bias current. These conditions set up the thermal and electrical bias fields similar to those present in an operating VCSEL, and insure the presence of minority carriers. Under these conditions the hydrogen and other mobile defects coalesce or move to a final distribution so that the long-term variation in performance is minimized. During the burn-in, multiple simultaneous effects can change threshold current and other important characteristics.

Interstitial hydrogen has an affinity for certain acceptors and tends to migrate to the site of the acceptor and form a hydrogen-acceptor complex. The phenomenon is described in Fushimi et al., "Degradation Mechanism in Carbon-doped GaAs Minority-carrier Injection Devices," 1996 IEEE International Reliability Physics Proceedings, (1996), pp. 214–220, which is incorporated herein by reference. When hydrogen diffuses into the conducting region just above the quantum wells, it will compensate the acceptors and cause the sheet resistance to rise. An increase in lateral sheet resistance under the oxide will result in more rapid radial debiasing and a decrease in threshold current.

The ionized interstitial hydrogen atom forms a positive ion in the semiconductor lattice. The polarity of the electric field under operating bias will cause unpaired hydrogen to drift toward the junction perimeter. For example, such a phenomenon is reported by Shi et al., "Photoluminescene study of hydrogenated aluminum oxide-semiconductor interface," Appl. Phys. Lett. 70 (10), 10 Mar. 1997, pp. 1293–1295, which is incorporated herein by reference. Shi et al. indicates that hydrogen decreases the surface recombination velocity at an oxide/semiconductor interface. This ability of hydrogen to neutralize surface states probably also applies to the damage centers produced by an isolation implant. Hydrogen drifted to the junction perimeter during the stabilization burn-in can reduce the "2kT" current by neutralizing the deep traps and bring about a decrease in threshold current. In a similar manner, hydrogen that diffuses into the quantum well region can neutralize the "nkT" non-radiative centers under the gain guide implant. This will also cause a decrease in threshold current.

The relative contributions of these and other mechanisms vary from design to design and from process to process. The one constant is that some change is typical during initial operation of a VCSEL. If the application is sensitive to such changes, the VCSEL should be stabilized before it is employed in the application. This is true even when, as is typical in the case of Honeywell VCSELs, early degradation failures are extremely rare.

The insulating oxide layer in the VCSEL fabrication process is formed by the wet oxidation of a high-Al (e.g., typically 97–98%) layer of AlGaAs located in the top Bragg mirror. In a typical VCSEL, the top mirror is p-type. The surrounding high-Al layers in the p-type Bragg mirror have Al composition of approximately 85%, which causes them to oxidize at a much slower rate than the 98% layer. In the course of oxidation, the AlGaAs material surrounding the oxide layer is compensated by defects generated by the oxidation process. The result is that the effective insulating region defined by the oxidation comprises the oxide layer thickness plus approximately two Bragg mirror periods above and below the oxide layer.

The defect centers that produce this dead zone can be removed through the use of a high temperature annealing step immediately following the wet oxidation. The high temperature anneals to remove the defect centers have been performed and verified using the same process monitor test structures that originally allowed the dead zone to be identified. The defect centers in question can diffuse and drift within the VCSEL over operating life and cause instability in the VCSEL characteristic. Removal of the defect centers eliminates a significant variable from the process and makes it possible to optimize the VCSEL in a stable and reproducible way.

To date, positive identification of the defect centers has not been possible. It is likely, however, that the defects are interstitial hydrogen released by the wet oxidation of the high-Al layer. Interstitial hydrogen is known to function as a shallow donor, which tends to pair with and compensate the carbon acceptors used in the p-type Bragg mirror. It is also well known in the art that interstitial hydrogen can be removed through the use of a high-temperature anneal. A similar process can be utilized to remove the incidental hydrogen incorporated in the material during the MOCVD growth step.

The sheet resistance of the p-type material under the oxide layer is an important parameter in determining the performance of an oxide VCSEL. In order to achieve the desired sheet resistance of 1000 Ohm/sq when the hydrogen is present, the oxide layer should be placed in the fourth mirror period. Movement of the hydrogen defect, however, during burn-in or over the operating life of the VCSEL can cause the VCSEL properties to change and thereby give rise to unwanted instabilities in device characteristics, such as for example, threshold current and slope efficiency. The use of a high-temperature annealing step immediately after the wet oxidation makes it possible to control the sheet resistance under the oxide by accurate placement of the oxide layer. With the interstitial hydrogen removed, the VCSEL characteristics are more predictable and stable during burn-in and over the operating life of the VCSEL.

In addition to time variability in behavior in any given device, the variation from device to device can be reduced by manipulation of the dead zone. The location and thickness of the oxide are known precisely, being set by the epitaxial structure of the VCSEL. The dead zone is not so precisely controlled, thus it may be of variable width from wafer to wafer due to minor variations of the oxidation or other processes. Wafer-to-wafer uniformity can be improved by annealing the dead zone, leaving behind the more precisely controlled oxide alone. A method for identifying the presence of the dead zone is thus disclosed herein, which aids in the design and fabrication of reliable and consistent oxide VCSEL devices.

Figure 3:
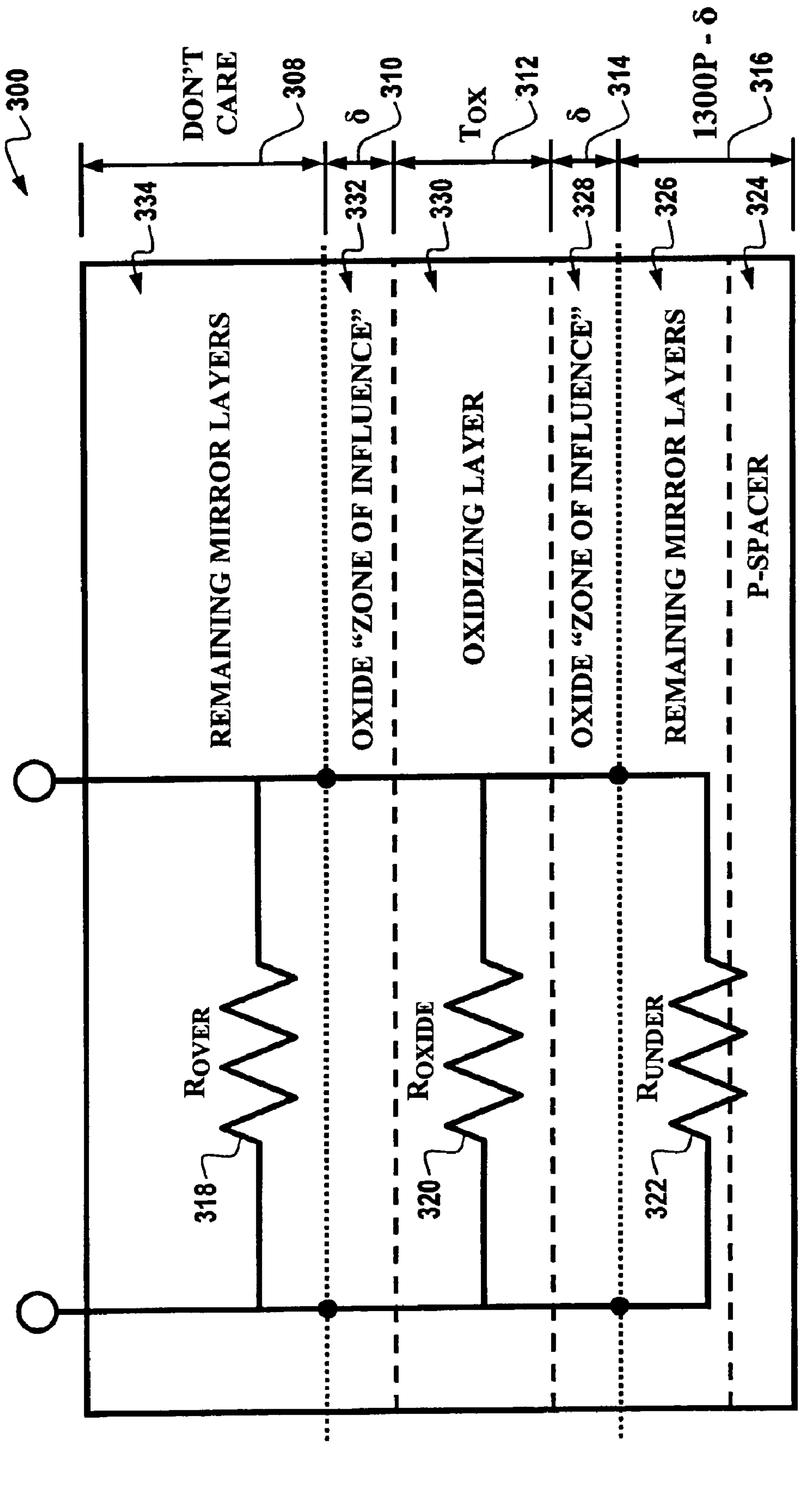
FIG. 3 illustrates a block diagram of the resistance in different regions of a VCSEL, which can be measured or calculated from test structures, which can be implemented in accordance with a preferred embodiment of the present invention.

FIG. 3 illustrates a block diagram of a VCSEL structure 300. The sheet resistance of all layers above the junction can be conceptually decomposed into the parallel combination of resistors 318, 320, and 322. Before oxidation, the resistance of the layer which will be oxidized and the surrounding dead zone (collectively identified as 320) have a finite value; after oxidation this value becomes effectively infinite. As described below, when appropriately disposed, structures for measurement of sheet resistance, such as the well-known van der Pauw configuration, allow computation of the pre-oxidation resistance of 318, 320, and 322. While a VCSEL structure 300 is illustrated to indicate the need for a method for evaluating semiconductor devices, such as VCSELs, to enhance stability and reliability thereof, the VCSEL structure 300 and the described test structures are not a limiting feature of the present invention but are presented primarily for illustrative and general edification purposes only.

As indicated previously, the oxidation process utilized in the fabrication of a VCSEL device can produce a zone of high resistance that is much thicker than the oxide itself. Assuming there are layers of insulating material on either side of the oxide, the effective thickness, δ, of such layers can be calculated. As indicated in FIG. 3, VCSEL structure 300 includes a p-space layer 324, which is located beneath mirror layers 326. An oxide zone of influence 328 is located above mirror layers 326. An oxidizing layer is located above oxide zone influence 328 and below an oxide zone of influence 332. In turn, mirror layers 334 are located above oxide zone of influence 332.

In a typical VCSEL structure 300, which can be configured from one or more semiconductor wafers, each wafer essentially possesses three van der Pauw structures to measure different sheet resistances. One resistance that may be measured is associated with the total p-mirror layer and can be measured as a parallel resistance combination of $R_{OVER}$, $R_{OXIDE}$, and $R_{UNDER}$, as respectively indicated by resistors 318, 320, and 322 in FIG. 3. Alternatively, a resistance over the oxide, $R_{OVER}$, can be measured (see resistor 320), or a resistance over and under the oxide which is determined as a parallel combination of $R_{OVER}$ and $R_{UNDER}$. Each structure can be measured in all four orientations. The resulting values can then be checked for consistency and averaged. Other values, such as $R_{OXIDE}$ and $R_{UNDER}$ can be algebraically deduced from the measured values.

Several assumptions may be made in order to evaluate VCSEL structure 300 based on the aforementioned resistances as will become apparent to those skilled in the art. The first assumption involves lateral resistance, which is approximately the same for every layer in the lower p-mirror (i.e., the bottom 10 periods or so) and for the p-spacer layer 324, which itself is approximately one mirror period thick. The oxidizing layer 330 occupies the bottom-most position in its nominal period. The effective thickness, δ, is assumed to be symmetric, the same below and above the oxidizing layer 330, as indicated by arrows 310 and 314. Note that arrow 312 indicates a thickness $T_{ox}$ of oxidizing layer 330. It may also be assumed that no other geometry affects the resulting test calculations. Note that arrow 308 indicates that the thickness of mirror layers 334 is not of a concern (illustrated as "Don't Care" in FIG. 3). Additionally, thickness of p-spacer layer 324 and mirror layers 326 is indicated by arrow 316. Thus, under such circumstances the following calculation is achieved, as indicated in equation (1) below, where P is the nominal period in which the oxide is in, and each mirror period is approximately 1300 Å thick:

$$\delta = \frac{1300PR_{UNDER} - t_{OX}R_{OXIDE}}{2R_{OXIDE} + R_{UNDER}} \qquad \text{Eq. (1)}$$

For other VCSEL structural configurations, the value 1300P is adjusted to represent the thickness of material nominally between the oxide layer and the active junction.

Figure 4:
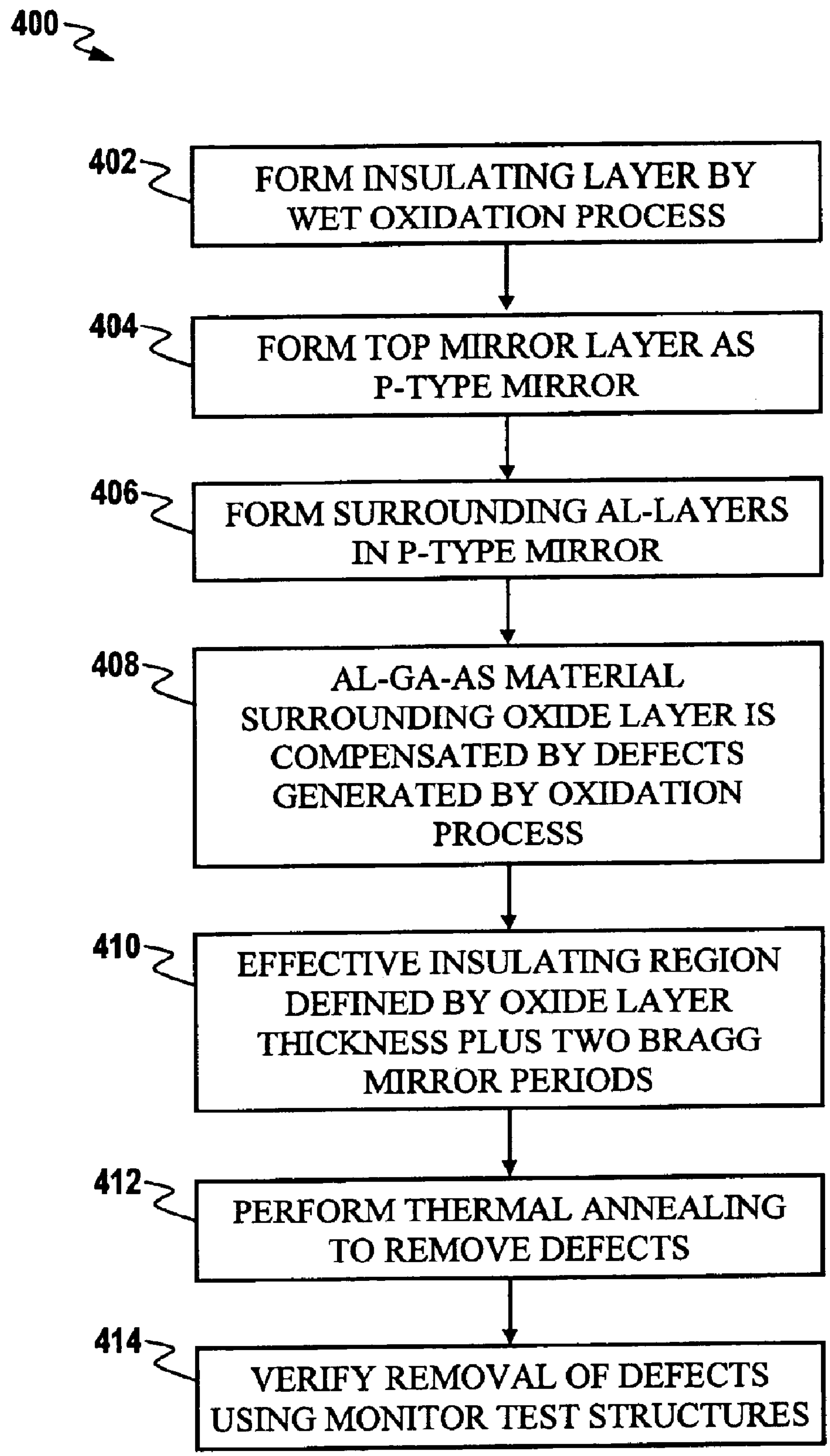
FIG. 4 depicts a high-level flow chart of operations illustrating a general methodology for removing defects and a dead zone thereof in a VCSEL structure, in accordance with a preferred embodiment of the present invention.

FIG. 4 depicts a high-level flow chart 400 of operations illustrating a general methodology for removing defects and a dead zone thereof in a VCSEL structure, in accordance with a preferred embodiment of the present invention. As indicated at block 402, the insulating oxide layer in the VCSEL fabrication process can be formed by the wet oxidation of a high-aluminum (i.e., typically 97%–98%) layer of AlGaAs located in the top Bragg mirror thereof. As indicated at block 404, the top mirror may be formed as a p-type mirror. As illustrated next at block 406, the layers surrounding the p-type mirror (i.e., a p-type Bragg mirror) can be formed having an Al composition of approximately 85%, which causes them to oxidize at a much slower rater than the 97–98% layer mentioned previously. In the course of the oxidation, as illustrated next at block 408, the AlGaAs material surrounding the oxide layer is compensated by defects generated by the oxidation process. As illustrated at block 410, the result is that the effective insulating region defined by the oxidation is generally the oxide layer thickness plus approximately two Bragg mirror periods (e.g., above and below the oxide layer). Thus, the formation of the oxide layer in an oxide VCSEL or other semiconductor devices can result in the generation of defects that compensate the material around the oxide layer. Therefore, a dead zone surrounds the oxide layer. The defect centers that produce this dead zone can be removed by the use of a high temperature annealing step immediately following the wet oxidation step, as indicated at block 412. The thermal annealing step can take place, for example, at 575° C. for 15 minutes. Thereafter, as illustrated at block 414, the high temperature-annealing step to remove the defect centers can be verified utilizing monitor test structures that originally allowed the dead zone to be identified. After removal of the dead zone, the characteristics of the material between the oxide and the active region can be selectively and controllably modified by, for example, proton implantation.

The present invention disclosed herein thus describes a method for removing an oxide-induced dead zone in a semiconductor device structure. In general, a semiconductor device structure can be formed having at least one oxide layer and an oxide-induced dead zone thereof. A thermal annealing operation can then be performed upon the semiconductor device structure to remove the oxide-induced dead zone, thereby permitting oxide semiconductor device structures thereof to be reliably and consistently fabricated. An oxidation operation may initially be performed upon the semiconductor device structure to form the oxide layer and the associated oxide-induced dead zone. The thermal annealing operation is preferably performed upon the semiconductor device after performing a wet oxidation operation upon the semiconductor device structure.

In general, at least one defect associated with the oxide layer may be generated as a result of performing the wet oxidation operation upon the semiconductor device structure. Detecting interstitial hydrogen released as a result of the wet oxidation operation performed upon the semiconductor device structure may identify a defect center associated with it. Additionally, a p-type material is generally located below the oxide layer, wherein the p-type material possesses a sheet resistance thereof. The sheet resistance of the p-type material located under the oxide layer is thus an important parameter in determining the performance of an oxide semiconductor device formed thereof. The interstitial hydrogen may be removed via the thermal annealing operation performed upon the semiconductor device structure. The semiconductor device structure can comprise a VCSEL. The oxide layer itself can be configured as an insulating oxide layer. The present invention described herein can thus be utilized in association with VCSEL devices and/or other semiconductor device structures to improve control and stability thereof. The present invention thus applies to any semiconductor device relying on the oxidation of, for example, aluminum containing III-V semiconductors.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive nor to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A method for removing an oxide-induced dead zone in a semiconductor device structure, said method comprising:

forming a semiconductor device structure having at least one oxide layer and an oxide-induced dead zone thereof; and performing a thermal annealing operation upon said semiconductor device structure to remove said oxide-induced dead zone, while substantially retaining the at least one oxide layer.

2. The method of claim 1 further comprising:

performing an oxidation operation upon said semiconductor device structure to form said at least one oxide layer and said oxide-induced dead zone thereof.

3. The method of claim 1 wherein performing a thermal annealing operation upon said semiconductor device structure to remove said oxide-induced dead zone, further comprises:

performing said thermal annealing operation upon said semiconductor device after performing a wet oxidation operation upon said semiconductor device structure.

4. The method of claim 1 further comprising:

generating at least one defect associated with said at least one oxide layer as a result of performing a wet oxidation operation upon said semiconductor device structure.

5. The method of claim 4 further comprising:

locating a p-type material below said at least one oxide layer, wherein said p-type material possesses a sheet resistance thereof.

6. The method of claim 5 further comprising:

removing at least one defect through said thermal annealing operation performed upon said semiconductor device structure.

7. The method of claim 1 wherein said semiconductor device structure comprises a VCSEL.

8. The method of claim 7 wherein said VCSEL comprises an oxide VCSEL.

9. The method of claim 1 further comprising:

modifying a resistance of a region within which said oxide-induced dead zone is removed by implanting protons therein to control a sheet resistance thereof.

10. The method of claim 1 further comprising:

modifying a resistance of a region within which said oxide-induced dead zone is removed by implanting ions therein to control a sheet resistance thereof.

11. The method of claim 1 further comprising:

calculating the thickness of insulating layers, associated with the oxide-induced dead zone, based on factors including: a nominal period which the oxide layer is in; a thickness of a mirror period; a thickness of the oxide layer; and, sheet resistances of the semiconductor device structure.

12. The method of claim 11, wherein the sheet resistances include a resistance over the oxide layer, a resistance of the oxide layer, and a resistance under the oxide layer.

* * * * *